US010636933B2

(12) United States Patent
Kawahara et al.

(10) Patent No.: US 10,636,933 B2
(45) Date of Patent: Apr. 28, 2020

(54) TILTED PHOTODETECTOR CELL

(71) Applicant: Texas Instruments Incorporated, Dallas, TX (US)

(72) Inventors: Hideaki Kawahara, Plano, TX (US); Henry Litzmann Edwards, Garland, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/979,071

(22) Filed: Dec. 22, 2015

(65) Prior Publication Data

US 2017/0179329 A1 Jun. 22, 2017

(51) Int. Cl.
| H01L 31/18 | (2006.01) |
| H01L 27/144 | (2006.01) |
| H01L 31/02 | (2006.01) |
| H01L 31/036 | (2006.01) |

(52) U.S. Cl.
CPC ...... *H01L 31/1804* (2013.01); *H01L 27/1443* (2013.01); *H01L 31/02005* (2013.01); *H01L 31/036* (2013.01)

(58) Field of Classification Search
CPC ......... H01L 27/14603; H01L 27/14609; H01L 27/14689; H01L 31/107; H01L 27/14658; H01L 27/1446; H01L 31/1804; H01L 31/036; H01L 27/1443; H01L 31/02005; H01L 27/14678
USPC ............................................. 257/290; 438/57
See application file for complete search history.

(56) References Cited

U.S. PATENT DOCUMENTS

| 4,110,122 A | 8/1978 | Kaplow et al. |
| 4,131,984 A * | 1/1979 | Kaplow ................ H01L 31/068 136/249 |
| 4,200,472 A | 4/1980 | Chappell et al. |
| 7,459,367 B2 * | 12/2008 | Voegeli ............... H01L 21/8249 257/E21.358 |
| 7,482,667 B2 * | 1/2009 | Guidotti ............... G02B 6/4202 257/458 |

(Continued)

OTHER PUBLICATIONS

Notification of Transmittal of the International Search Report and the Written Opinion of the International Searching Authority, or the Declaration, dated Apr. 6, 2017.

*Primary Examiner* — Changhyun Yi
(74) *Attorney, Agent, or Firm* — Andrew R. Ralston; Charles A. Brill; Frank D. Cimino

(57) ABSTRACT

A photodetector cell includes a substrate having a semiconductor surface layer, and a trench in the semiconductor surface layer. The trench has tilted sidewalls including a first tilted sidewall and a second tilted sidewall. A pn junction, a PIN structure, or a phototransistor includes an active p-region and an active n-region that forms a junction including a first junction along the first tilted sidewall to provide a first photodetector element and a second junction spaced apart from the first junction along the second tilted sidewall to provide a second photodetector element. At least a p-type anode contact and at least an n-type cathode contact contacts the active p-region and active n-region of the first photodetector element and second photodetector element. The tilted sidewalls provide an outer exposed or optically transparent surface for passing incident light to the first and second photodetector elements for detection of incident light.

27 Claims, 8 Drawing Sheets

(56) References Cited

U.S. PATENT DOCUMENTS

| | | | |
|---|---|---|---|
| 10,177,193 B2* | 1/2019 | Mollard | H01L 27/1443 |
| 2001/0039067 A1* | 11/2001 | Yiu | H01L 31/0352 |
| | | | 438/29 |
| 2003/0209743 A1* | 11/2003 | Park | H01L 27/14603 |
| | | | 257/290 |
| 2004/0121532 A1 | 6/2004 | Seo | |
| 2005/0279998 A1 | 12/2005 | Cole et al. | |
| 2006/0186503 A1* | 8/2006 | Guidotti | G02B 6/4202 |
| | | | 257/458 |
| 2007/0158664 A1* | 7/2007 | Rothman | H01L 27/144 |
| | | | 257/88 |
| 2007/0187734 A1 | 8/2007 | Adkisson et al. | |
| 2008/0067622 A1* | 3/2008 | Bui | H01L 27/1446 |
| | | | 257/458 |
| 2009/0184317 A1* | 7/2009 | Sanfilippo | H01L 27/1446 |
| | | | 257/49 |
| 2011/0175188 A1* | 7/2011 | Bui | H01L 31/035281 |
| | | | 257/443 |
| 2014/0252524 A1* | 9/2014 | Sanfilippo | H01L 27/14643 |
| | | | 257/432 |
| 2015/0323381 A1* | 11/2015 | Kautzsch | G01J 1/1626 |
| | | | 250/208.2 |
| 2015/0349151 A1* | 12/2015 | Mollard | H01L 27/1443 |
| | | | 257/443 |
| 2017/0187376 A1* | 6/2017 | Nunnally | H03K 17/795 |

\* cited by examiner

TILTED PHOTODETECTOR CELL

FIELD

Disclosed embodiments relate to photodetectors including for angle detection of an incident beam of light.

BACKGROUND

A photodiode is a light detecting semiconductor device which converts light into an electrical current. A photodiode generally comprises a pn junction or a PIN structure comprising an undoped intrinsic semiconductor region interposed between a p-type semiconductor region and an n-type semiconductor region. Current is generated by photon illumination when photons having at least the bandgap energy of the semiconductor are absorbed in the photodiode. When a photon of such sufficient energy strikes the photodiode, valence band electrons are excited to the conduction band leaving holes in their place in the valence band, thus creating an electron-hole pair.

To detect the angle and direction of an incident light beam of interest, a guiding lens together with several separate photodiodes are generally used. A conventional photodiode has a planar receiving surface, sometimes with an anti-reflective (AR) coating thereon. One known arrangement has a plurality of photodiode chips with each photodiode chip positioned for detecting a different photon angular range. In this arrangement, each individual photodiode needs to be aligned accurately to one another for detected angle accuracy.

SUMMARY

This Summary is provided to introduce a brief selection of disclosed concepts in a simplified form that are further described below in the Detailed Description including the drawings provided. This Summary is not intended to limit the claimed subject matter's scope.

Disclosed embodiments describe trench-based integrated photodetector cells having a tilted sidewall structure that align the respective photodetector elements in the cells so that no alignment step for aligning the photodetector elements is needed as with conventional solutions for detecting the angle and direction of an incident light beam. Disclosed tilted photodetector cells are integrated photodetector cells having a single merged structure as the photodetector elements in each cell are all formed in the same trench.

A photodetector cell includes a substrate having a semiconductor surface layer, and a trench formed in the semiconductor surface layer. The trench has tilted sidewalls including a first tilted sidewall and a second tilted sidewall. A pn junction, a PIN structure, or a phototransistor includes an active p-region and an active n-region that forms a junction including a first junction along the first tilted sidewall to provide a first photodetector element and a second junction spaced apart from the first junction along the second tilted sidewall to provide a second photodetector element. At least a p-type anode contact and at least an n-type cathode contact contacts the active p-region and active n-region, respectively, of the first and second photodetector elements. The tilted sidewalls provide an outer exposed or optically transparent surface for passing incident light to the first and second photodetector elements for detection of incident light.

BRIEF DESCRIPTION OF THE DRAWINGS

Reference will now be made to the accompanying drawings, which are not necessarily drawn to scale, wherein.

DETAILED DESCRIPTION

Figure 1A:
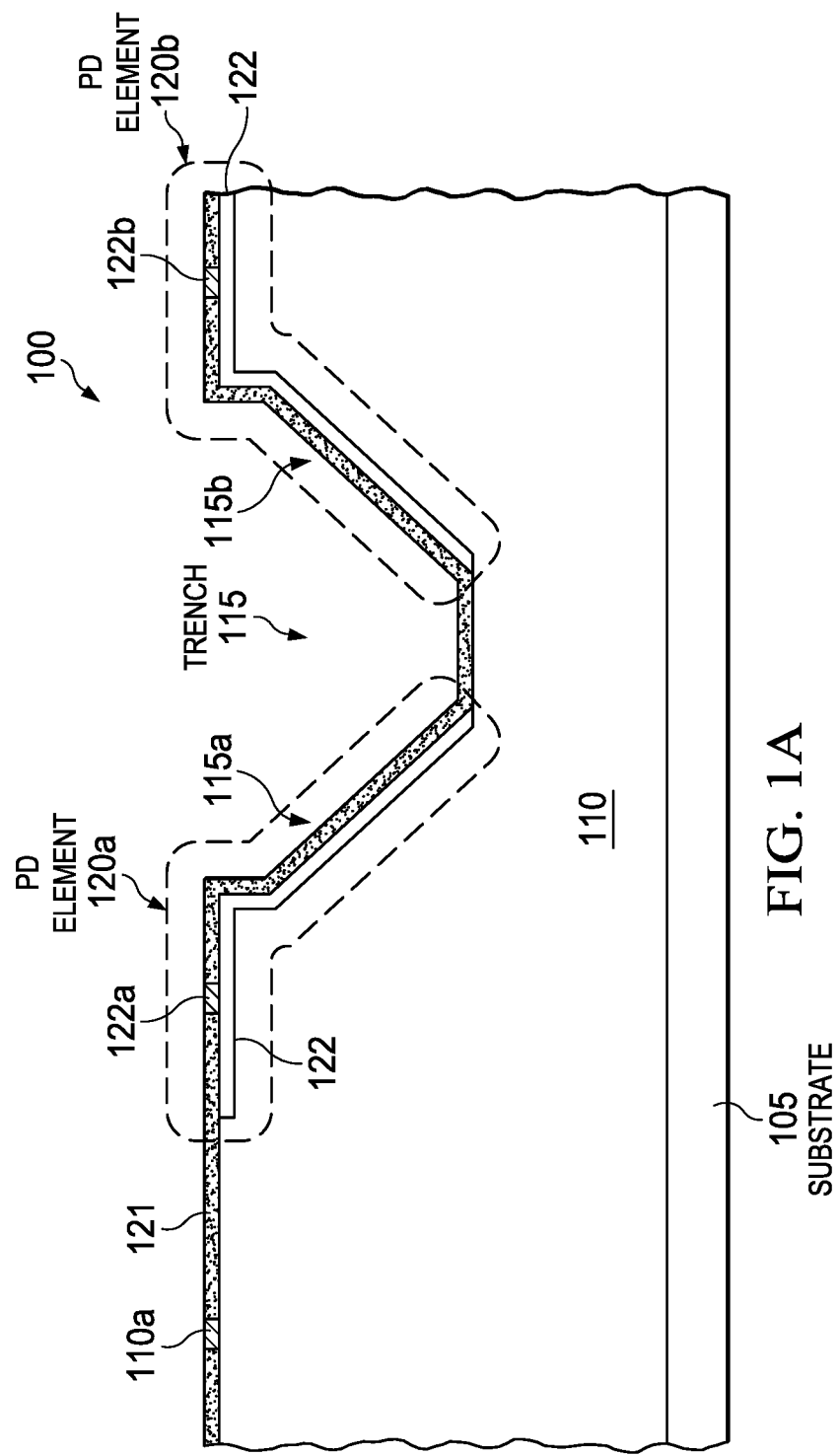
FIG. 1A depicts an example tilted photodetector cell having top surface photodetector contacts, according to an example embodiment.

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

FIG. 1A depicts an example tilted photodetector cell 100 having top side planar surface photodetector contacts through a surface dielectric layer (e.g., silicon oxide) 121, according to an example embodiment. Photodetector cell 100 is generally used to determine the incident angle (θ) of received incident light, such as by using a computing device implementing a stored plot (or relation) of luminous flux angle vs. photodetector current (see FIG. 6A described below).

The photodetector cell 100 includes a substrate 105 having a semiconductor surface layer 110. In the embodiment described herein, the substrate 105 and the semiconductor surface layer 110 are both p-type. A bulk substrate material can provide both the substrate 105 and semiconductor surface layer 110, or the substrate 105 can comprise a bulk substrate material having an epitaxial layer thereon to provide the semiconductor surface layer 110. A trench 115 is formed in the semiconductor surface layer 110. The trench can be formed by a wet etch and in some applications by a dry etch (e.g. deep reactive ion etch (DRIE)). Example substrate materials include silicon which can be wet alkaline (hydroxide-based) facet etched and gallium arsenide (GaAs) which can be DRIE etched.

The trench 115 has tilted sidewalls including a first tilted sidewall 115a and a second tilted sidewall 115b. A 1-axis detector has 2 tilted sidewalls in the trench and for a 2-axis detector the trench 115 has 4 tilted sidewalls. As used herein a "tilted sidewall" refers to the sidewalls being angled at 15 to 75 degrees relative to a surface normal at a top of the semiconductor surface layer 110. The sidewalls are generally angled at 30 to 60 degrees relative to the surface normal.

A pn junction, a PIN structure, or a phototransistor includes an active p-region that can be provided by the semiconductor surface layer 110 and an active n-region 122 that forms at least a pn junction including along the first tilted sidewall 115a to provide a first photodetector element 120a and along the second tilted sidewall 115b to provide a second photodetector element 120b. The active n-region 122 includes a gap at the bottom of the trench 115 so that the first photodetector element 120a and second photodetector element 120b are spaced apart from one another to enable operating independently as separate photodetector elements. An ion implant with a photoresist masking pattern can be implemented to exclude doping at the bottom of the trench 115, or a hard mask pattern for a diffusion doping process. The photodetector elements 120a, 120b each convert energy from sufficiently energetic photons received into electrical current.

Doped regions disclosed herein such as the active n-region 122 (or an active p-region if the semiconductor surface layer 110 is not used as the active p-region) can be formed by ion implantation or generally also by a diffusion doping method. Regarding diffusion doping, a bubbler can utilize force bubbles through a liquid based-dopant source, such as $POCl_3$ diffusion for forming n-type regions or a boron tribromide ($BBr_3$) diffusion for forming p-type regions.

Figure 1B:
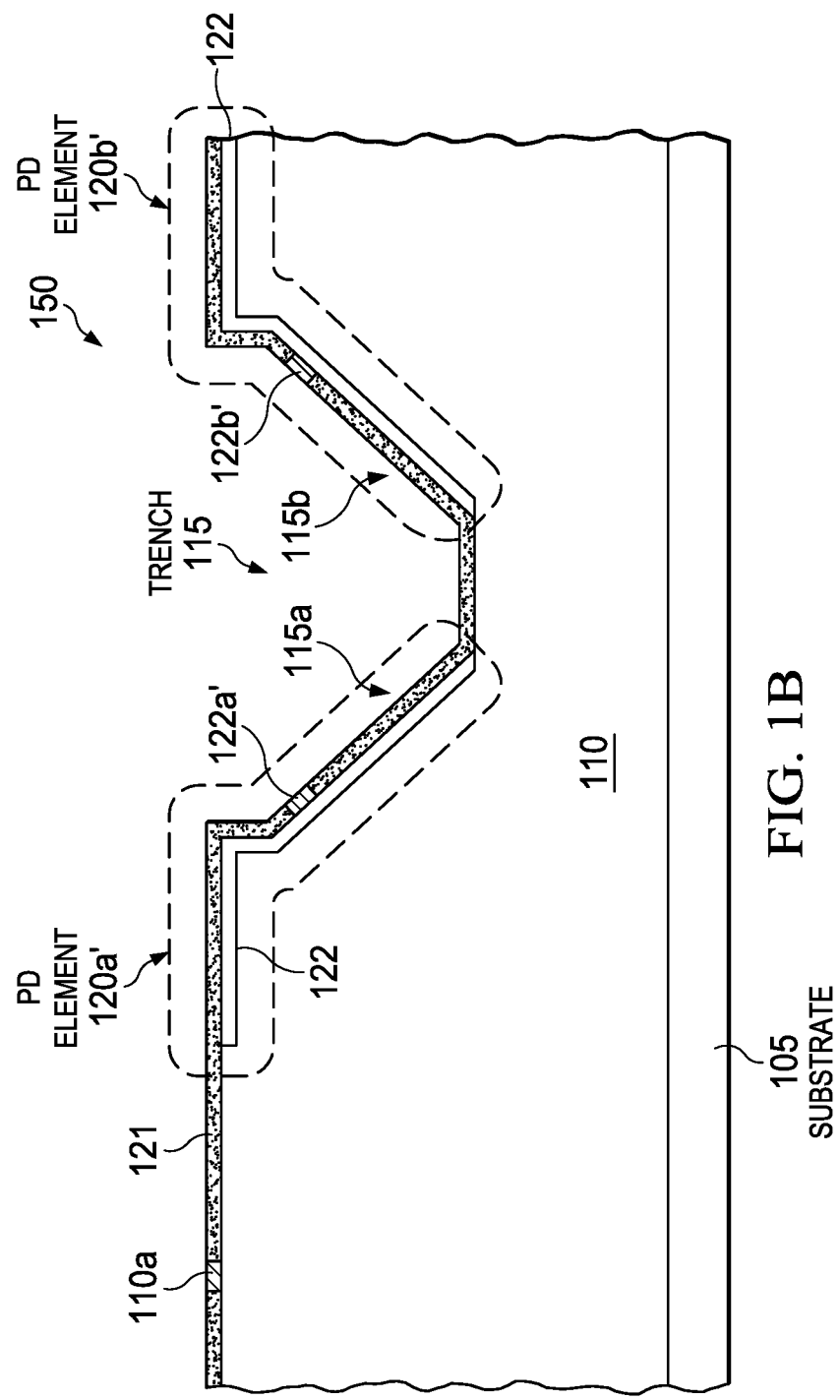
FIG. 1B depicts an example tilted photodetector cell having photodetector contacts on the tilted sidewalls, according to an example embodiment.

A p-type anode contact 110a contacts the semiconductor surface layer 110 and a first n-type cathode contact 122a contacts the active n-region 122 of the first photodetector element and a second n-type cathode contact 122b contacts the active n-region 122 of the second photodetector element. The p-type anode contact 110a and n-type cathode contacts 122a and 122b can comprise metal contacts or silicide contacts. The order of the semiconductor surface layer 110 (or other p-type region) and active n-region 122 can be reversed to that shown. In the case of a PIN structure, an intrinsic semiconductor layer is interposed between the active p-region and active n-region. FIG. 1B depicts an example tilted photodetector cell 150 having first and second photodetector elements 120a', 120b' with photodetector contacts 122a' and 122b' on the tilted sidewalls 115a, 115b, according to an example embodiment.

Figure 1C:
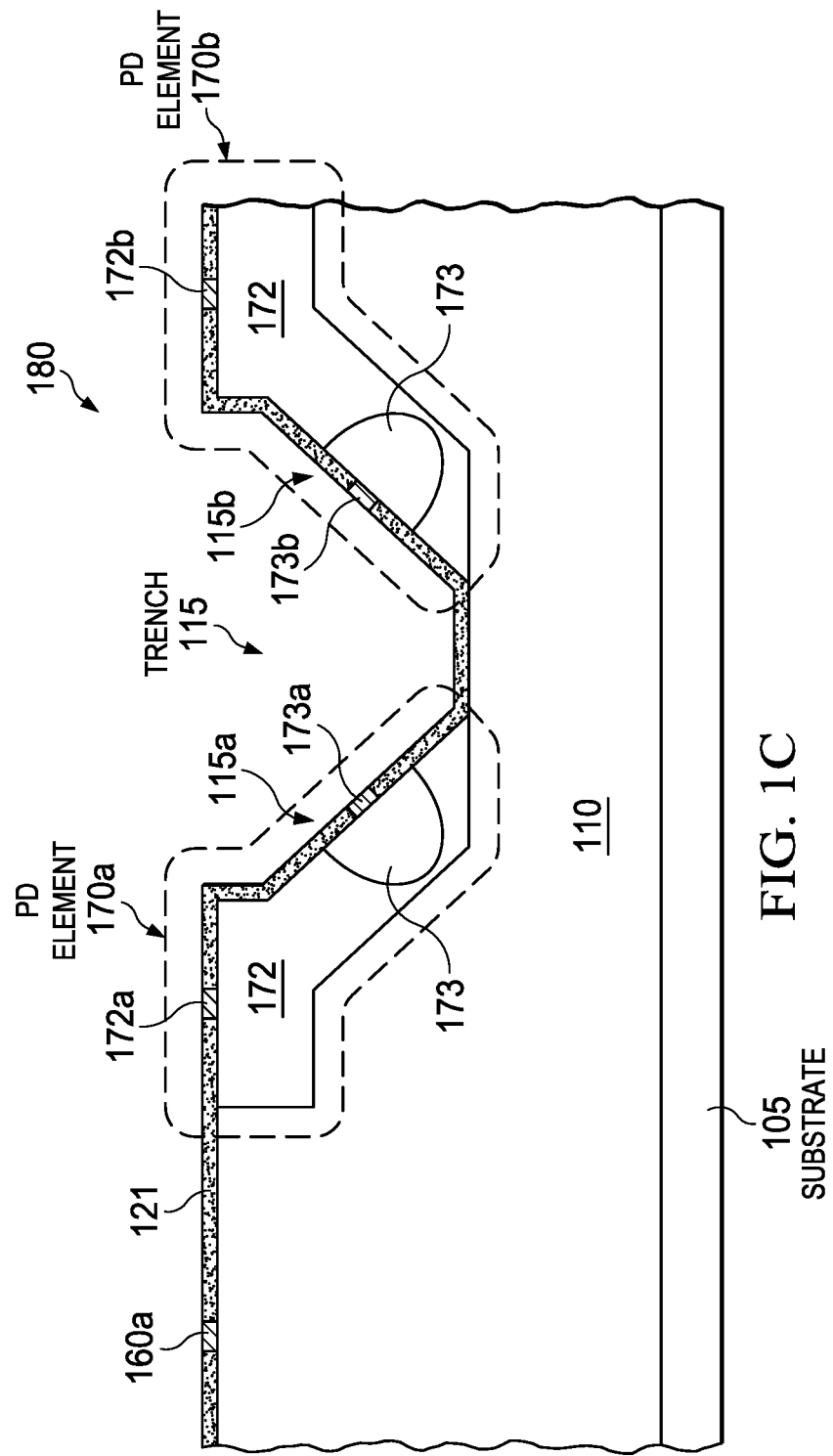
FIG. 1C depicts an example tilted photodetector cell having photodetector contacts on the tilted sidewalls comprising bipolar phototransistor elements, according to an example embodiment.

In the case of a phototransistor a third doped region is provided to form a bipolar transistor. FIG. 1C shows an example photodetector cell 180 having photodetector contacts on the tilted sidewalls comprising bipolar phototransistor elements 170a and 170b, according to an example embodiment. Phototransistor elements 170a and 170b include an emitter 173, a base 172, and a collector provided by the semiconductor surface layer 110. Phototransistor element 170a includes an emitter contact 173a, and a base contact 172a, while phototransistor element 170b includes an emitter contact 173b and a base contact 172b. Phototransistor element 170a and phototransistor element 170b share a collector contact 160a. In operation, electrons that are generated by photons received in the base—collector junction are injected into the base 172, and this photodiode current is amplified by the transistor's current gain $\beta$ (or $h_{fe}$). If the emitters 173 are left unconnected (floating), the phototransistor elements each operate as a photodiode.

The tilted sidewalls are shown having an outer exposed surface being the active n-region 122. Although not shown in FIGS. 1A-1C, there can be one or more optically transparent surface layers on the active n-region 122. Such layers can include one or more of an anti-reflective (AR) layer and a passivation layer such as silicon oxide, silicon nitride, or silicon oxynitride for passing incident light to the first and second photodetector elements for detection of the incident light.

Figure 2:
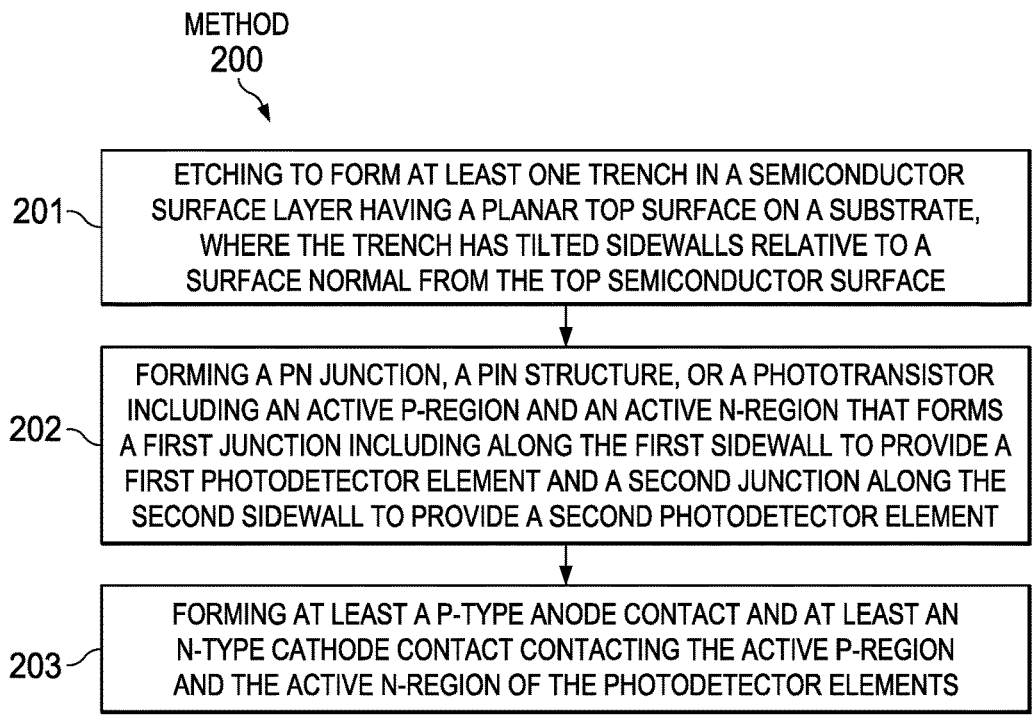
FIG. 2 is a flow chart that shows steps in an example method of forming a tilted photodetector cell, according to an example embodiment.

FIG. 2 is a flow chart that shows steps in an example method 200 of forming at least one tilted photodetector cell, according to an example embodiment. Step 201 comprises etching to form at least one trench in a semiconductor surface layer having a planar top surface on a substrate, where the trench has tilted sidewalls relative to a surface normal from the top of the semiconductor surface layer. As describe above, the titled sidewalls are not vertical walls, typically being angled 30 to 60 degrees relative to the surface normal. Other angles can be used, but a maximum sensitivity for angle detection is for angles outside of 30 to 60 degrees. As noted above, the etching can comprise wet etching, such as a hydroxide etch in the case of silicon, or a dry etch such as a DRIE.

Step 202 comprises forming a pn junction, a PIN structure, or a phototransistor including an active p-region (such as semiconductor surface layer 110 in FIG. 1A) and an active n-region 122 that forms a first junction including along the first sidewall to provide a first photodetector element and a second junction spaced apart from the first junction along the second sidewall to provide a second photodetector element. Step 202 can comprise ion implantation or a diffusion doping such as a $POCl_3$ for n-type doping or $BBr_3$ for p-type doping. The active p-region if formed as a diffused region and an active n-region 122 are both generally less than 1 µm deep. The step 202 doping is generally after the etching to form the trench (step 201), but for LOCOS processing (see FIG. 3A and 3B described below) the doping can be performed either before or after LOCOS oxide growth.

Step 203 comprises forming at least a p-type anode contact and at least an n-type cathode contact contacting the active p-region (e.g., semiconductor surface layer 110) and the active n-region 122 of the first photodetector element 120a and the second photodetector element 120b. The respective contacts can be planar (as shown in FIG. 1A described above) or sidewall contacts (as shown in FIG. 1B described above) and are generally formed through a dielectric layer 121 on the active p-region (e.g., semiconductor surface layer 110) and on the active n-region 122.

Figure 3A:
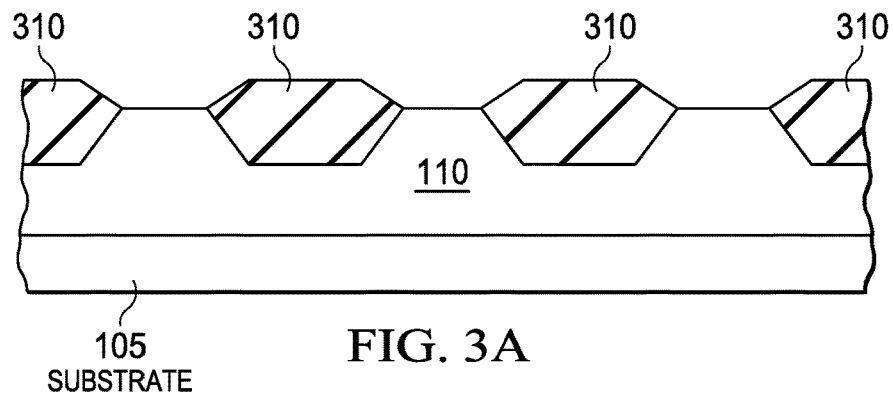
FIGS. 3A and 3B show cross sectional depictions after several step steps in a LOCOS-based method for forming a disclosed tilted photodiode cell or an array of such cells.
Figure 3B:
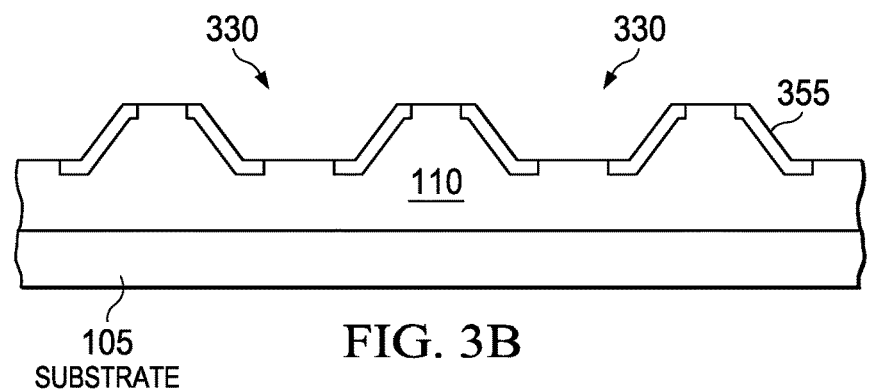

FIGS. 3A and 3B show cross sectional depictions after several step steps in a LOCOS-based method for forming a disclosed tilted photodiode cell or an array of such cells. FIG. 3A shows LOCOS regions 310 comprising LOCOS oxide formed in a semiconductor surface layer 110 on a substrate 105. As known in the art, to perform LOCOS, the areas not meant to be oxidized are coated with a material that does not permit the diffusion of oxygen at high temperatures (thermal oxidation is performed at temperatures between 900° C. and 1200° C.), such as a silicon nitride masking layer. FIG. 3B shows the resulting trenches 330 with tilted sidewalls following a typical wet (e.g., HF-based etchant) etching of the LOCOS regions 310 shown in FIG. 3A. The angle for the sidewalls in this case is generally 30 degrees to 60 degrees. The approximate trench depth for this LOCOS process is about 0.1 µm up to about 1 µm.

Existing implants (e.g., threshold adjust for MOS or BiMOS ICs) in given IC process can be used for the tilted photodiode cell so that there are no masks added to implement the photodiode cell. The implants can be performed before the growth of the LOCOS regions 310 so that they are underneath the LOCOS regions 310 after LOCOS formation, or as shown as doped regions 355 resulting from an implant or diffusion doping process using a dedicated photodiode mask after the removal of the LOCOS regions 310. Second doped regions (not shown) can be formed to generate a pn junction or a PIN structure, or the semiconductor surface layer 110 as described above can be used as the other doped region.

Figure 4A:
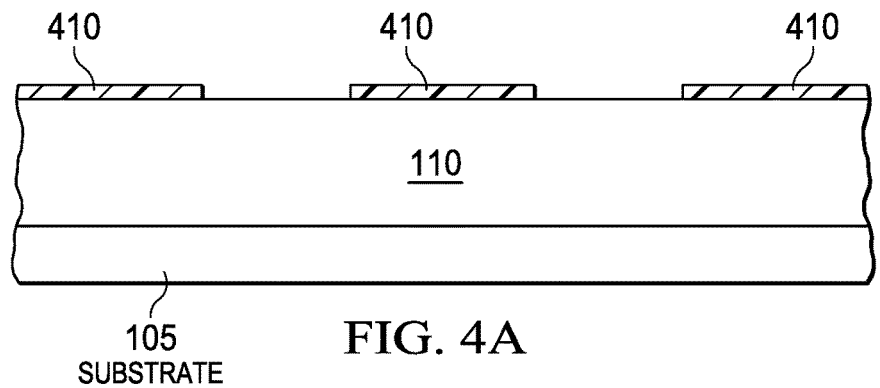
FIGS. 4A and 4B show cross sectional depictions after several steps in a wet silicon etch-based method for forming a disclosed tilted photodiode cell or array of such cells.
Figure 4B:
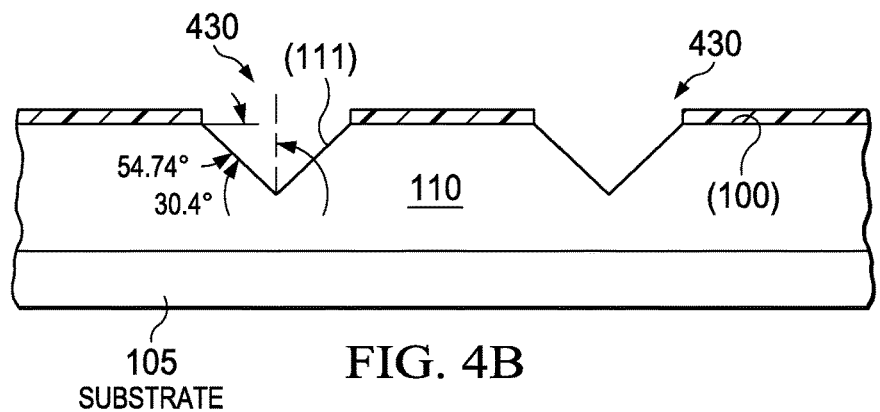

FIGS. 4A and 4B show cross sectional depictions after several steps in a wet silicon etch-based method for forming a disclosed tilted photodiode cell or an array of such cells. FIG. 4A shows a patterned etch masking material (e.g. photoresist, or a hard mask material) 410 on a semiconductor surface layer 110 on a substrate 105. In this embodiment the semiconductor surface layer 110 comprises silicon.

FIG. 4B shows trenches 430 in a V-groove shape resulting after etching crystalline silicon of the semiconductor surface layer 110 using a wet silicon etchant such as a being hydroxide etch KOH (potassium hydroxide) or TMAH (tetramethyl ammonium hydroxide), or EDP (ethylenediamene pyrocatecol) which comprises ethylenediamine, pyrocatechol, pyrazine and water. The approximate trench depth for this wet silicon etch-based method is generally about 5 µm to about 100 µm.

The trenches 430 have with tilted sidewalls relative to a surface normal from the top surface of the semiconductor surface layer 110 including a first tilted sidewall and a second tilted sidewall. The alkaline chemistries (e.g., KOH) have the ability to preferentially etch the silicon along the crystal orientation which makes it possible to create geometries difficult to produce with other micromachining techniques (for example the V-grooves shown). The etching rate is dependent on the orientation of the silicon's crystal planes, where crystal orientations of <100> and <110> etch differently than <111> due to the arrangement of atoms (and as a result the silicon (atom) density) at these orientations. Silicon <100> for example etches anisotropically along the <111> crystal plane, with the 54.74° angle shown relative to the <100> plane as shown in FIG. 4B. In this embodiment the angle the trenches 430 make with the surface normal from the top surface of the semiconductor surface layer 110 is 30.4°.

Figure 5A:
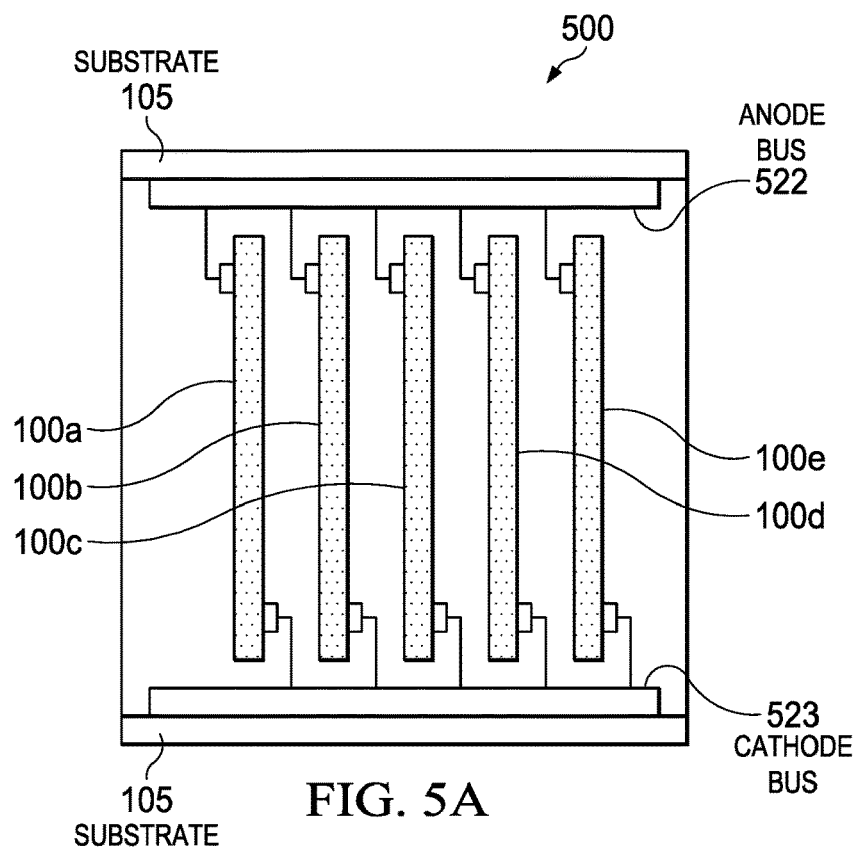
FIGS. 5A, 5B and 5C show top perspective views of arrays of disclosed tilted photodiode cells.
Figure 5B:
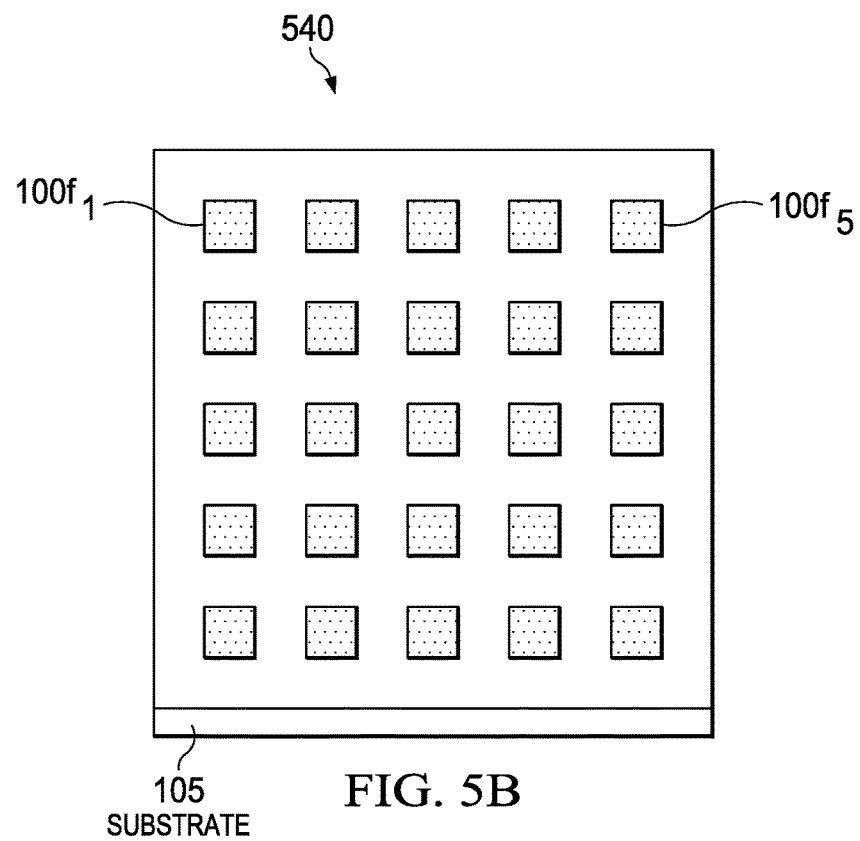
Figure 5C:
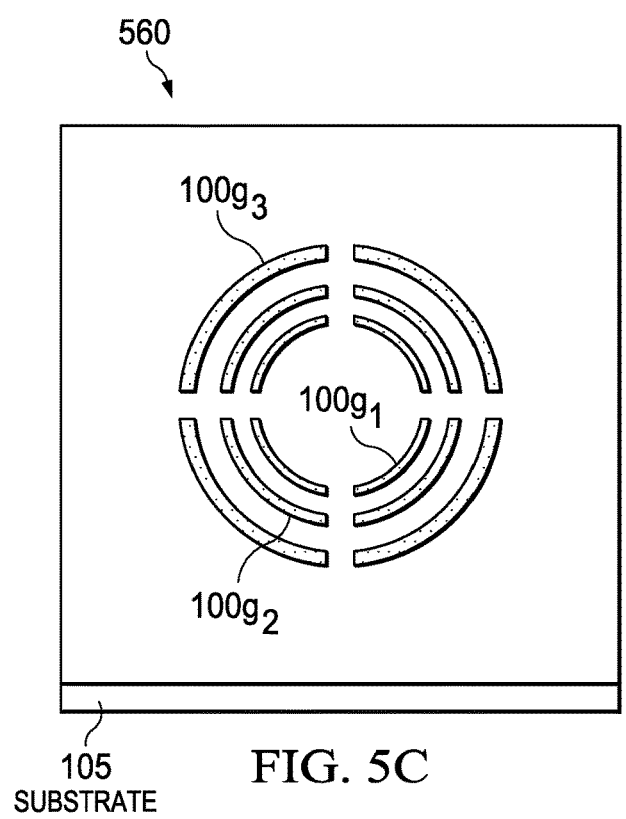

FIGS. 5A, 5B and 5C show top perspective views of arrays of disclosed tilted photodiode cells. Each photodetector cell in the array can have essentially the same spectral responsivity or a different spectral responsivity by changing the dopant concentration in one or both of the p-region and n-region. By using a different photomask and different implant condition, e.g. opening the photoresist using mask-A for one region with one implant and then opening another region with mask-B for another implant for another region. For a LOCOS process, one can use a LOCOS Mask-LA and having LOCOS process for one sidewall area, and then use another LOCOS Mask-LB for another sidewall area sidewall for example. Although not shown, disclosed tilted photodiode cells can be coupled together (hooked up in parallel) using a through-oxide (or other dielectric) contact with a suitable interconnect (e.g., metal layer) anywhere on the p-region and anywhere on or n-region of the junction, although flat surface contacts such as shown in FIG. 1A are typically used.

FIG. 5A shows an example photodetector array 500 comprising five (5) integrated tilted photodiode cells shown as 100a, 100b, 100c, 100d and 100e formed on a substrate 105. Array 500 is configured for 1-axis (x-axis) angle detection. The contacts for the active p-regions of each cell and the contacts for the active n-regions of each cell including their respective first and second photodetector element are shown coupled together (hooked up in parallel). Anode bus 522 comprising a suitable interconnect (e.g., metal layer) is shown coupling together all the p-regions of the junction and a cathode bus 523 comprising a suitable interconnect (e.g., metal layer) is shown coupling together all the n-regions of the junctions.

FIG. 5B shows an example 2D photodetector array 540 comprising twenty five (25) integrated tilted photodiode cells with tilted photodiode cells $100f_1$ and $100f_5$ identified that are formed on a substrate 105. FIG. 5C shows an example photodetector array 560 comprising three (3) integrated tilted photodiode cells configured as concentric rings each having gaps that correspond to the spacing between photodetector elements described above (such as the gap in the active n-region 122 at the bottom of the trench shown in FIGS. 1A-1C described above) shown as $100g_1$, $100g_2$ and $100g_3$ on substrate 105. The photodiode cells $100g_1$, $100g_2$ and $100g_3$ each include a plurality of photodetector elements shown as each having 4 elements. The layout of photodetector array 560 thus allows 2-axis angular detection.

Disclosed tilted photodetectors can be used in a wide variety of light beam angle monitor applications including as an angle sensor as described above, or as an optical pick-up (optical disc), motion sensor, or phased array photonic sensor. Disclosed tilted photodetectors can be formed on an IC along with CMOS circuitry, such as using an analog process including bipolar CMOS DMOS (BCD) or a bipolar process.

EXAMPLES

Disclosed embodiments are further illustrated by the following specific Examples, which should not be construed as limiting the scope or content of this Disclosure in any way.

Figure 6A:
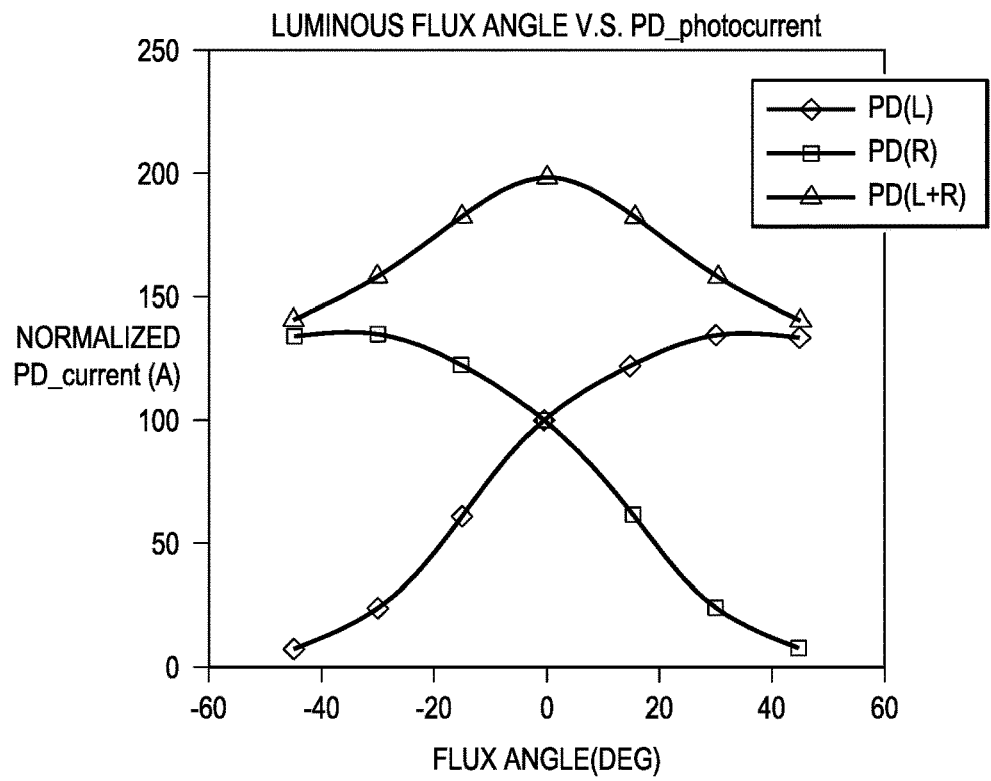
FIGS. 6A and 6B are simulations showing normalized photo-generated current vs. incident angle with FIG. 6A evidencing wide range angle coverage being for example, ±45°, with separate PD current vs flux angle plots for the left and right photodetector, and their total PD current vs. flux angle for a disclosed tilted photodetector cell, while FIG. 6B evidences the disclosed tilted photodetector element providing high sensitivity for angle detection across the angle coverage range being again for example, ±45°.
Figure 6B:
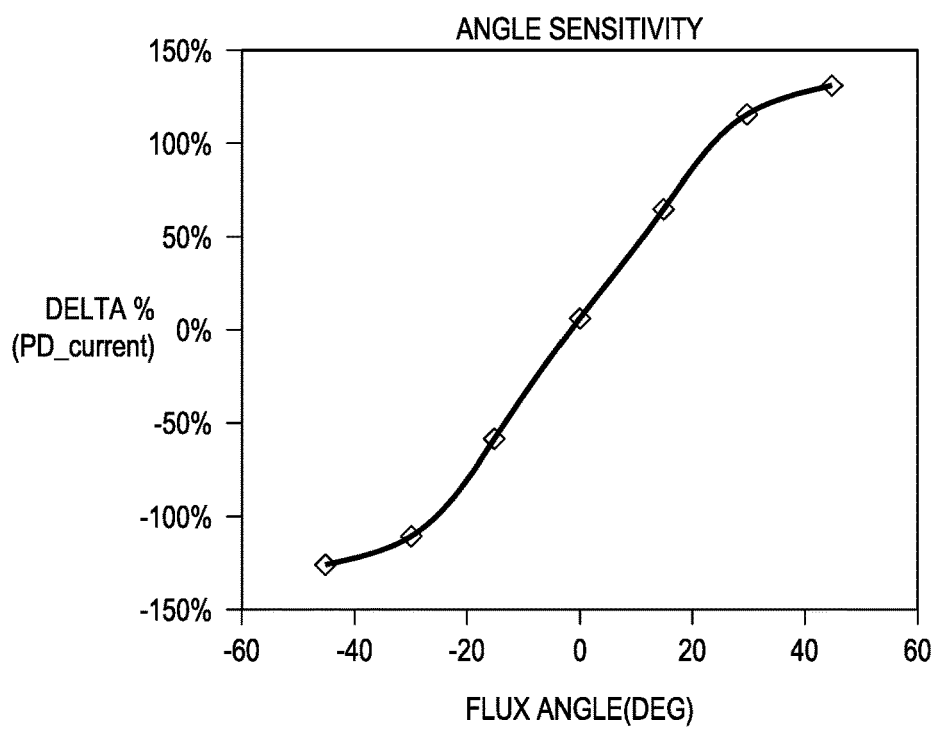

Disclosed pn junction tilted photodetector cells were formed using a silicon <100> substrate according to the process described relative to FIGS. 4A and 4B using KOH to a typically trench depth of 1 µm and using ion implantation. FIGS. 6A and 6B are simulations using a 2V reverse bias as an example evidencing wide range angle coverage being ±45° relative to the surface normal, with separate PD current vs flux angle plots for the left photodetector (shown as PD(L)) and right photodetector (shown as PD(R), and their total PD current vs. luminous flux angle for a disclosed tilted photodetector cell. FIG. 6B is one curve taken from FIG. 6A with the y-axis now delta (Δ) PD current which more clearly evidences the disclosed tilted photodetector element (e.g., PD(L)) providing high sensitivity (Δ PD current> from greater that −100% to +100%) for angle detection across an angle coverage range being ±45°.

Figure 7:
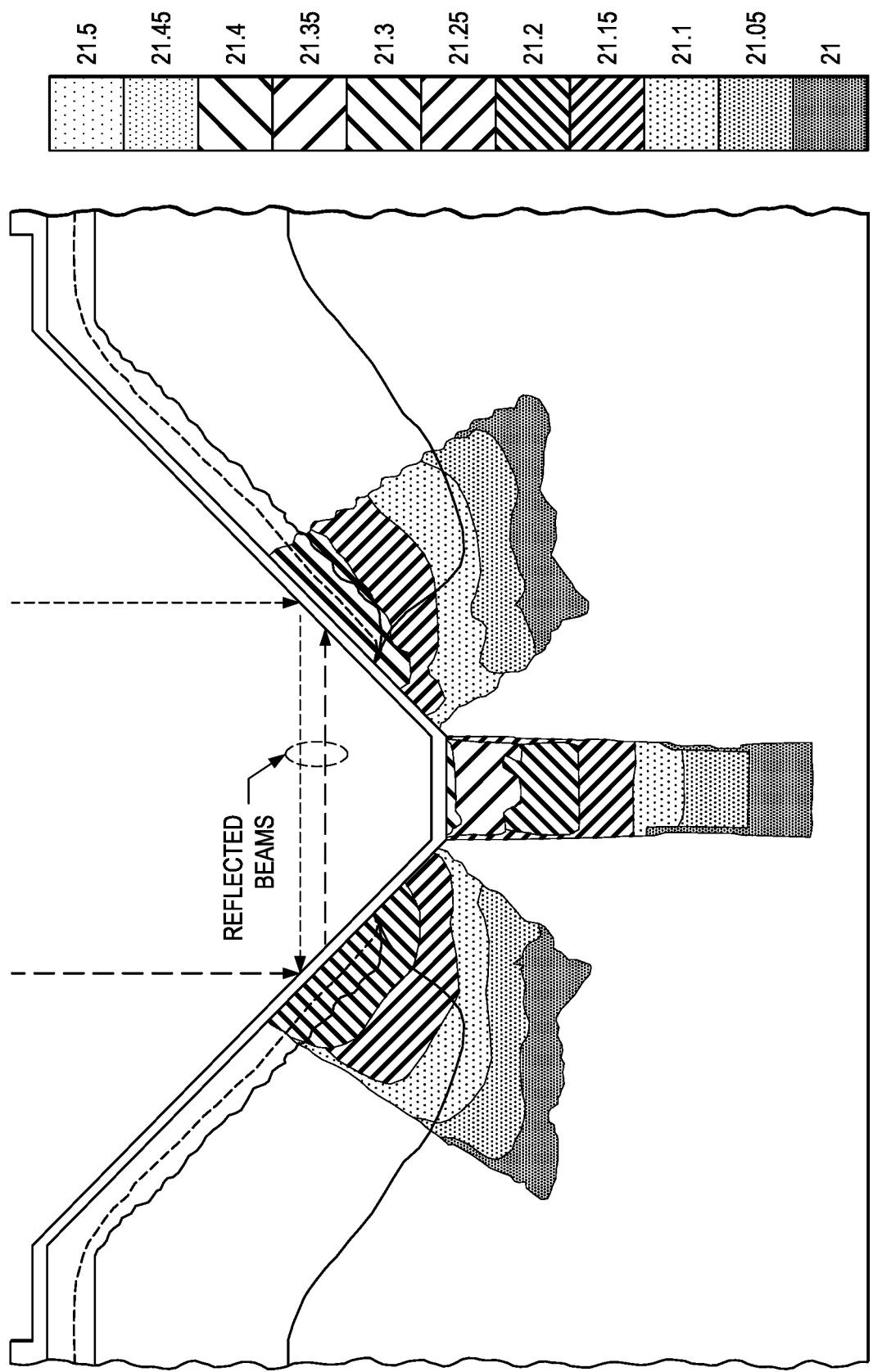
FIG. 7 Depicts a mechanism for enhanced efficiency of directivity in a photodetector application for a disclosed tilted photodetector cell that does not involve angle monitoring.

FIG. 7 depicts a mechanism for enhanced efficiency of directivity in a photodetector application for a disclosed tilted photodetector cell that does not involve angle monitoring. The photon conversion efficiency is shown to be enhanced by the redetecting provided by one tilted sidewall of reflected radiation emanating (and thus not detected) from another tilted sidewall. The center carrier generation can be ignored as it does not contribute to generation current since there is no electric field there, so that the generated carriers simply recombine there.

Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure.

The invention claimed is:

1. A photodetector cell, comprising:
a substrate having a semiconductor surface layer;
a trench in said semiconductor surface layer, said trench having a first tilted sidewall and a second tilted sidewall;
a bottom surface of said trench that connects said first tilted sidewall with said second tilted sidewall, said bottom surface located on said semiconductor surface layer;
a first photodetector element including a first n-doped region along said first tilted sidewall, the first n-doped region directly interfacing with said semiconductor surface layer to define a first pn junction;
a second photodetector element including a second n-doped region along said second tilted sidewall, the second n-doped region directly interfacing with said semiconductor surface layer to define a second pn junction, said second pn junction separated from said first pn junction; and
a conformal dielectric layer directly on a surface of the semiconductor surface layer, the sloped sidewall surfaces and the bottom surface.

2. The photodetector cell of claim 1, wherein a planar top surface of said semiconductor surface layer comprises silicon with a <100> crystal orientation.

3. The photodetector cell of claim 1, wherein said first and second tilted sidewalls are each angled at 30 to 60 degrees relative to a surface normal at a planar top surface of said semiconductor surface layer.

4. The photodetector cell of claim 1, wherein said bottom surface is free of said first and second n-doped regions.

5. The photodetector cell of claim 1, wherein said first n-doped region includes a first portion that extends over a planar top surface of said semiconductor surface layer, and said second n-doped region includes a second portion that extends over said planar top surface, and further comprising:
a first n-type contact contacting said first n-doped region at said first portion; and
a second n-type contact contacting said second n-doped region at said second portion.

6. The photodetector cell of claim 1, further comprising:
a first n-type contact contacting said first n-doped region along said first tilted sidewall; and
a second n-type contact contacting said second n-doped region along said second tilted sidewall.

7. The photodetector cell of claim 1, wherein the sloped sidewall surfaces make an angle of about 55 degrees with a surface of the semiconductor substrate.

8. The photodetector cell of claim 1, wherein the sloped sidewall surfaces are parallel to <111> crystal planes of the semiconductor substrate.

9. A photodetector cell, comprising:
a trench over a semiconductor substrate including first and second sloped sidewall surfaces and a bottom surface that connects said first and second sloped sidewall surfaces, the first and second sloped sidewall surfaces and the bottom surface all being located within a same semiconductor layer having a first conductivity type;
a first photodetector element located along said first sloped sidewall and including a first doped semiconductor region having a second conductivity type opposite the first conductivity type;
a second photodetector element located along said second sloped sidewall and including a second doped semiconductor region having said second conductivity type; and
a conformal dielectric layer directly on the sloped sidewall surfaces and the bottom surface.

10. The photodetector cell of claim 9, wherein a planar top surface of said semiconductor layer comprises silicon with a <100> crystal orientation.

11. The photodetector cell of claim 9, wherein said first and second sloped sidewalls are each angled at 30 to 60 degrees relative to a surface normal at a planar top surface of said semiconductor layer.

12. The photodetector cell of claim 9, wherein said bottom surface has a same doping as said semiconductor layer.

13. The photodetector cell of claim 9, wherein said first doped semiconductor region includes a first portion that extends over a planar top surface of said semiconductor layer, and said second doped semiconductor region includes a second portion that extends over said planar top surface.

14. The photodetector cell of claim 13, further comprising:
a first contact connected to said first portion of said first doped semiconductor region; and
a second contact connected to said second portion of said second doped semiconductor region.

15. The photodetector cell of claim 9, further comprising:
a first contact connected to said first doped semiconductor region directly over said first tilted sidewall; and
a second contact connected to said second doped semiconductor region directly over said second tilted sidewall.

16. The photodetector cell of claim 9, further comprising:
a contact connected to said semiconductor layer over a planar top surface of said semiconductor layer.

17. The photodetector cell of claim 9, wherein said semiconductor substrate is p-type and said first and second doped semiconductor regions are n-type.

18. The photodetector cell of claim 9, wherein the sloped sidewall surfaces make an angle of about 55 degrees with a surface of the semiconductor substrate.

19. The photodetector cell of claim 9, wherein the sloped sidewall surfaces are parallel to <111> crystal planes of the semiconductor substrate.

20. A photosensitive electronic device, comprising:
a plurality of photodetector cells arranged as an array of photodetector cells, each photodetector cell including:
a trench that has first and second sloped sidewall surfaces and a bottom surface that connects said first and second sloped sidewall surfaces, the first and second sloped sidewall surfaces and the bottom surface all being located within a same semiconductor layer having a first conductivity type;
a first photodetector element located along said first sloped sidewall and including a first doped semiconductor region having a second conductivity type opposite the first conductivity type; and
a second photodetector element located along said second sloped sidewall and including a second doped semiconductor region having said second conductivity type, wherein each photodetector cell of said array of photodetector cells is configured to have a different spectral responsivity.

21. The photosensitive electronic device of claim 20, wherein said array of photodetector cells is arranged as concentric rings.

22. The photosensitive electronic device of claim 20, wherein said each photodetector cell of the array of photodetector cells is configured as an elongated trench, and said array is configured as a linear array.

23. The photosensitive electronic device of claim 20, wherein said array of photodetector cells is configured as a two-dimensional array.

24. A photodetector cell, comprising:
a substrate having a semiconductor surface layer;
a trench in said semiconductor surface layer, said trench having a first tilted sidewall and a second tilted sidewall;
a bottom surface of said trench that connects said first tilted sidewall with said second tilted sidewall, said bottom surface located on said semiconductor surface layer;
a first photodetector element including a first n-doped region along said first tilted sidewall, the first n-doped region directly interfacing with said semiconductor surface layer to define a first pn junction;
a second photodetector element including a second n-doped region along said second tilted sidewall, the second n-doped region directly interfacing with said semiconductor surface layer to define a second pn junction, said second pn junction separated from said first pn junction; and
a p-type region within the first n-doped region, the p-type region intersecting a surface of the first tilted sidewall, a first contact that makes a direct electrical connection to the p-type region, a second contact that makes a direct electrical connection to the first n-type region, and a third contact that makes a direct electrical connection to the semiconductor surface layer.

25. The photodetector cell of claim 24, wherein the p-type region, first n-doped region and semiconductor surface layer are configured to operate as a phototransistor.

26. A photodetector cell; comprising:
a trench over a semiconductor substrate including first and second sloped sidewall surfaces and a bottom surface that connects said first and second sloped sidewall surfaces, the first and second sloped sidewall surfaces and the bottom surface all being located within a same semiconductor layer having a first conductivity type;
a first photodetector element located along said first sloped sidewall and including a first doped semiconductor region having a second conductivity type opposite the first conductivity type;
a second photodetector element located along said second sloped sidewall and including a second doped semiconductor region having said second conductivity type; and
a doped region of the second conductivity type within the first doped semiconductor region, the doped region of the second conductivity type intersecting a surface of the first sloped sidewall, a first contact that makes a direct conductive connection to the doped region of the second conductivity type, a second contact that makes a direct conductive connection to the first doped semiconductor region, and a third contact that makes a direct conductive connection to the semiconductor layer.

27. The photodetector cell of claim 26, wherein the doped region of the second conductivity type, first doped semiconductor region and semiconductor layer are configured to operate as a phototransistor.

* * * * *